United States Patent
Alvarado et al.

(10) Patent No.: US 10,141,202 B2
(45) Date of Patent: Nov. 27, 2018

(54) SEMICONDUCTOR DEVICE COMPRISING MOLD FOR TOP SIDE AND SIDEWALL PROTECTION

(71) Applicant: QUALCOMM Incorporated, San Diego, CA (US)

(72) Inventors: Reynante Tamunan Alvarado, San Diego, CA (US); Lizabeth Ann Keser, San Diego, CA (US); Jianwen Xu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 24 days.

(21) Appl. No.: 13/898,427

(22) Filed: May 20, 2013

(65) Prior Publication Data
US 2014/0339712 A1     Nov. 20, 2014

(51) Int. Cl.
*H01L 23/00*     (2006.01)
*H01L 21/56*     (2006.01)
(Continued)

(52) U.S. Cl.
CPC ............ *H01L 21/561* (2013.01); *B23K 26/40* (2013.01); *H01L 21/31127* (2013.01);
(Continued)

(58) Field of Classification Search
CPC ....... H01L 2924/00; H01L 2224/73265; H01L 2224/48227; H01L 2224/73204; H01L 2224/0231; H01L 2224/0239
See application file for complete search history.

(56) References Cited

U.S. PATENT DOCUMENTS 6,181,569 B1   1/2001   Chakravorty
7,160,756 B2 *  1/2007   Kripesh ............. H01L 23/3185
                                                  257/E21.502
(Continued)

FOREIGN PATENT DOCUMENTS

JP   2001135742 A   5/2001
JP   2001144213 A   5/2001
(Continued)

OTHER PUBLICATIONS

International Search Report and Written Opinion—PCT/US2014/037739—ISA/EPO—dated Sep. 16, 2014.

*Primary Examiner* — Marc Armand
*Assistant Examiner* — Quinton Brasfield
(74) *Attorney, Agent, or Firm* — Loza & Loza, LLP/Qualcomm

(57) ABSTRACT

Some implementations provide a semiconductor device that includes a substrate, several metal and dielectric layers coupled to the substrate, and a pad coupled to one of the several metal layers. The semiconductor device also includes a first metal layer coupled to the pad and an under bump metallization layer coupled to the first metal redistribution layer. The semiconductor device further includes a mold layer covering a first surface of the semiconductor device and at least a side portion of the semiconductor device. In some implementations, the mold layer is an epoxy layer. In some implementations, the first surface of the semiconductor device is the top side of the semiconductor device. In some implementations, the mold layer covers the at least side portion of the semiconductor device such that a side portion of at least one of the several metal layers and dielectric layers is covered with the mold layer.

21 Claims, 16 Drawing Sheets

(51) Int. Cl.
*H01L 23/31* (2006.01)
*H01L 21/78* (2006.01)
*H01L 21/311* (2006.01)
*B23K 26/40* (2014.01)
B23K 26/364 (2014.01)
B23K 103/16 (2006.01)
B23K 26/382 (2014.01)

(52) U.S. Cl.
CPC .......... *H01L 21/78* (2013.01); *H01L 23/3114* (2013.01); *H01L 23/3185* (2013.01); *B23K 26/364* (2015.10); *B23K 26/389* (2015.10); *B23K 2203/172* (2015.10); *H01L 23/3178* (2013.01); *H01L 24/05* (2013.01); *H01L 24/13* (2013.01); *H01L 2224/0401* (2013.01); *H01L 2224/05008* (2013.01); *H01L 2224/05147* (2013.01); *H01L 2224/05569* (2013.01); *H01L 2224/05572* (2013.01); *H01L 2224/05647* (2013.01); *H01L 2224/131* (2013.01); *H01L 2224/13022* (2013.01); *H01L 2224/94* (2013.01); *H01L 2924/12042* (2013.01); *H01L 2924/14* (2013.01)

(56) References Cited

U.S. PATENT DOCUMENTS

| | | |
|---|---|---|
| 7,919,833 B2 | 4/2011 | Park |
| 7,977,783 B1 | 7/2011 | Park et al. |
| 8,048,776 B2 | 11/2011 | Do et al. |
| 8,048,778 B1 * | 11/2011 | Ku .......................... H01L 21/78 257/E21.599 |
| 2003/0134453 A1 * | 7/2003 | Prabhu et al. ................ 438/113 |
| 2005/0095750 A1 | 5/2005 | Lo et al. |
| 2006/0043992 A1 | 3/2006 | Jimi |
| 2006/0169680 A1 | 8/2006 | Park |
| 2007/0108573 A1 | 5/2007 | Chung et al. |
| 2007/0267743 A1 | 11/2007 | Mizusawa et al. |
| 2008/0006910 A1 * | 1/2008 | Miyata ................. H01L 23/3114 257/622 |
| 2009/0243097 A1 * | 10/2009 | Koroku ................. H01L 21/561 257/737 |
| 2009/0298234 A1 * | 12/2009 | Lee ......................... H01L 21/78 257/E21.599 |
| 2010/0072635 A1 * | 3/2010 | Kuo ........................ H01L 21/78 257/797 |
| 2010/0193226 A1 * | 8/2010 | Lin ....................... H05K 3/3452 174/257 |
| 2012/0104604 A1 | 5/2012 | McCarthy et al. |
| 2013/0017650 A1 | 1/2013 | Xu et al. |
| 2013/0026618 A1 * | 1/2013 | Chen ................... H01L 23/3192 257/737 |
| 2013/0043586 A1 | 2/2013 | Feron et al. |
| 2013/0320522 A1 * | 12/2013 | Lai et al. ..................... 257/737 |
| 2014/0048926 A1 | 2/2014 | Wang et al. |

FOREIGN PATENT DOCUMENTS

| | | |
|---|---|---|
| JP | 2009111333 A | 5/2009 |
| JP | 2009231791 A | 10/2009 |
| JP | 2011176069 A | 9/2011 |

* cited by examiner

SEMICONDUCTOR DEVICE COMPRISING MOLD FOR TOP SIDE AND SIDEWALL PROTECTION

BACKGROUND

Field

Various features relate to a semiconductor device comprising a mold for top side and sidewall protection.

Background

A typical die is manufactured by depositing several metal layers and several dielectric layers on top of a substrate. The die is manufactured by using a wafer level packaging (WLP) process. The substrate, metal layers and dielectric layers are what form the circuit elements of the die. Multiple dies are usually manufactured on a wafer. FIG. 1 illustrates a plan view of a wafer 100 that includes several uncut dies 102. Each uncut die includes a substrate, metal layers and dielectric layers. The wafer 100 is then cut into individual/single dies. FIG. 1 also illustrates vertical and horizontal scribe lines 102-104. Scribe lines are portions of the wafer 100 that are cut in order to manufacture the individual dies (e.g., die 102).

FIG. 2 illustrates a side view of a wafer. Specifically, FIG. 2 illustrates a side view of a portion of a wafer 200. The wafer 200 includes several metal and dielectric layers 202, a pad 204, a passivation layer 206, a first insulation layer 208, a first metal layer 210, a second insulation layer 212, and an under bump metallization (UBM) layer 214. FIG. 2 also illustrates a solder ball 216 on the wafer 200. Specifically, the solder ball 216 is coupled to the UBM layer 214. The pad 204, the first metal layer 210 and the UBM layer 214 are a conductive material (e.g., copper). The first insulation layer 208 and the second insulation layer 212 are polyimide layers (PI), Polybenzoxazole (PBO) or other polymer layers used for repassivation. FIG. 2 also illustrates a region of the wafer 200 that will be cut to create individual dies. This region of the wafer 200 is illustrated by the scribe line 218, which may correspond to either of the scribe lines 104-106 of FIG. 1.

During the process of cutting the wafer (e.g., wafers 100, 200) into one or more dies, a lot of stress (e.g., thermal stress, mechanical stress) is applied to the die. The resulting stress on the die may affects components of the die and/or the package, including the metal layers, the dielectric layers, the passivation layer, the UBM layer, and/or the solder balls. The metal layers, the dielectric layers and the passivation layer of the die are especially susceptible to stress. In particular, low K (LK) dielectrics or extremely low K (ELK), or ultra low K (ULK) dielectrics tend to be brittle and can easily crack/chip under stress. This stress can result in the chipping and/or cracking of the die, which ultimately results in a defective die.

Therefore, there is a need for a design to stop and/or prevent the propagation of a crack and/or chipping of a die.

SUMMARY

Various features, apparatus and methods described herein provide a semiconductor device comprising a mold for top side and sidewall protection.

A first example provides a semiconductor device that includes a substrate, several metal and dielectric layers coupled to the substrate, and a pad coupled to one of the several metal layers. The semiconductor device also includes a first metal layer coupled to the pad and an under bump metallization (UBM) layer coupled to the first metal redistribution layer. The semiconductor device further includes a mold layer covering a first surface of the die and at least a side portion of the semiconductor device.

According to an aspect, the mold layer is an epoxy layer. In some implementations, the mold layer is a clear epoxy layer.

According to one aspect, the first surface of the semiconductor device is the top side of the semiconductor device.

According to an aspect, the mold layer covers the at least side portion of the semiconductor device such that a side portion of at least one of the several metal layers and dielectric layers is covered with the mold layer.

According to one aspect, the semiconductor device further includes a passivation layer coupled to one of the several metal layers, a first insulation layer located between the passivation layer and the first metal redistribution layer, and a second insulation layer located between the first metal redistribution layer and the mold layer. In some implementations, the mold layer covers the at least side portion of the semiconductor device such that a side portion of the passivation layer is covered with the mold layer. In some implementations, the mold layer covers the at least side portion of the die such that a side portion of the first insulation layer is covered with the mold layer. In some implementations, the mold layer covers the at least side portion of the semiconductor device such that a side portion of the second insulation layer is covered with the mold layer. In some implementations, the first insulation layer is one of at least a polyimide layer, a Polybenzoxazole (PbO) layer and/or a polymer layer.

According to an aspect, the semiconductor device is one of at least a die, a die package, an integrated circuit (IC), and/or an interposer.

According to one aspect, the semiconductor device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A second example provides an apparatus that includes a substrate, several metal layers and dielectric layers coupled to the substrate, a pad coupled to one of the several of metal layers, a first metal redistribution layer coupled to the pad, an under bump metallization (UBM) layer coupled to the first metal redistribution layer, and a means for protecting the apparatus from cracking during a cutting process, the means for protecting covering a first surface of the apparatus and at least a side portion of the apparatus.

According to an aspect, the means for protecting is an epoxy layer. In some implementations, the means for protecting is a clear epoxy layer.

According to one aspect, the first surface of the apparatus is the top side of the apparatus.

According to an aspect, the means for protecting covers the at least side portion of the apparatus such that a side portion of at least one of the several metal layers and dielectric layers is covered with the means for protecting.

According to one aspect, the apparatus further includes a passivation layer coupled to one of the several metal layers, a first insulation layer located between the passivation layer and the first metal redistribution layer, and a second insulation layer located between the first metal redistribution layer and the mold layer. In some implementations, the means for protecting covers the at least side portion of the apparatus such that a side portion of the passivation layer is covered with the means for protecting. In some implementations, the means for protecting covers the at least side portion of the apparatus such that a side portion of the first insulation layer is covered with the means for protecting. In some implementations, the means for protecting covers the at least side portion of the apparatus such that a side portion of the second insulation layer is covered with the means for protecting. In some implementations, the first insulation layer is one of at least a polyimide layer, a Polybenzoxazole (PbO) layer and/or a polymer layer.

According to an aspect, the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A third example provides a method for providing a semiconductor device. The method provides a substrate. The method also provides several metal layers and dielectric layers coupled to the substrate. The method further provides a pad coupled to one of the several metal layers. The method provides a first metal redistribution layer coupled to the pad. The method also provides an under bump metallization (UBM) layer coupled to the first metal redistribution layer. The method further provides a mold layer covering a first surface of the semiconductor device and at least a side portion of the semiconductor device.

According to an aspect, the mold layer is an epoxy layer. In some implementations, the mold layer is a clear epoxy layer.

According to one aspect, the first surface of the semiconductor device is the top side of the semiconductor device.

According to an aspect, the mold layer covers the at least side portion of the semiconductor device such that a side portion of at least one of the several metal layers and dielectric layers is covered with the mold layer.

According to one aspect, the method further includes providing a passivation layer coupled to one of the several metal layers, providing a first insulation layer located between the passivation layer and the first metal redistribution layer, and providing a second insulation layer located between the first metal redistribution layer and the mold layer. In some implementations, the mold layer covers the at least side portion of the semiconductor device such that a side portion of the passivation layer is covered with the mold layer. In some implementations, the mold layer covers the at least side portion of the semiconductor device such that a side portion of the first insulation layer is covered with the mold layer. In some implementations, the mold layer covers the at least side portion of the semiconductor device such that a side portion of the second insulation layer is covered with the mold layer. In some implementations, the first insulation layer is one of at least a polyimide layer, a Polybenzoxazole (PbO) layer and/or a polymer layer.

According to an aspect, the semiconductor device is one of at least a die, a die package, an integrated circuit (IC), and/or an interposer.

According to one aspect, the semiconductor device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.
Overview Some novel features pertain to a semiconductor device (e.g., die, interposer) that includes a substrate, several metal and dielectric layers coupled to the substrate, and a pad coupled to one of the several metal layers. The semiconductor device (e.g., die) also includes a first metal layer coupled to the pad and an under bump metallization (UBM) layer coupled to the first metal redistribution layer. The semiconductor device (e.g., die) further includes a mold layer covering a first surface of the semiconductor device (e.g., die) and at least a side portion of the semiconductor device (e.g., die). In some implementations, the mold layer is an epoxy layer (e.g., clear epoxy layer). In some implementations, the first surface of the semiconductor device (e.g., die) is the top side of the semiconductor device (e.g., die). In some implementations, the mold layer covers the at least side portion of the semiconductor device (e.g., die) such that a side portion of at least one of the several metal layers and dielectric layers is covered with the mold layer. In some implementations, the semiconductor device (e.g., die) further includes a passivation layer coupled to one of the several metal layers, a first insulation layer located between the passivation layer and the first metal redistribution layer, and a second insulation layer located between the first metal redistribution layer and the mold layer.

Exemplary Die with Mold for Top Side and Sidewall Protection

Figure 1:
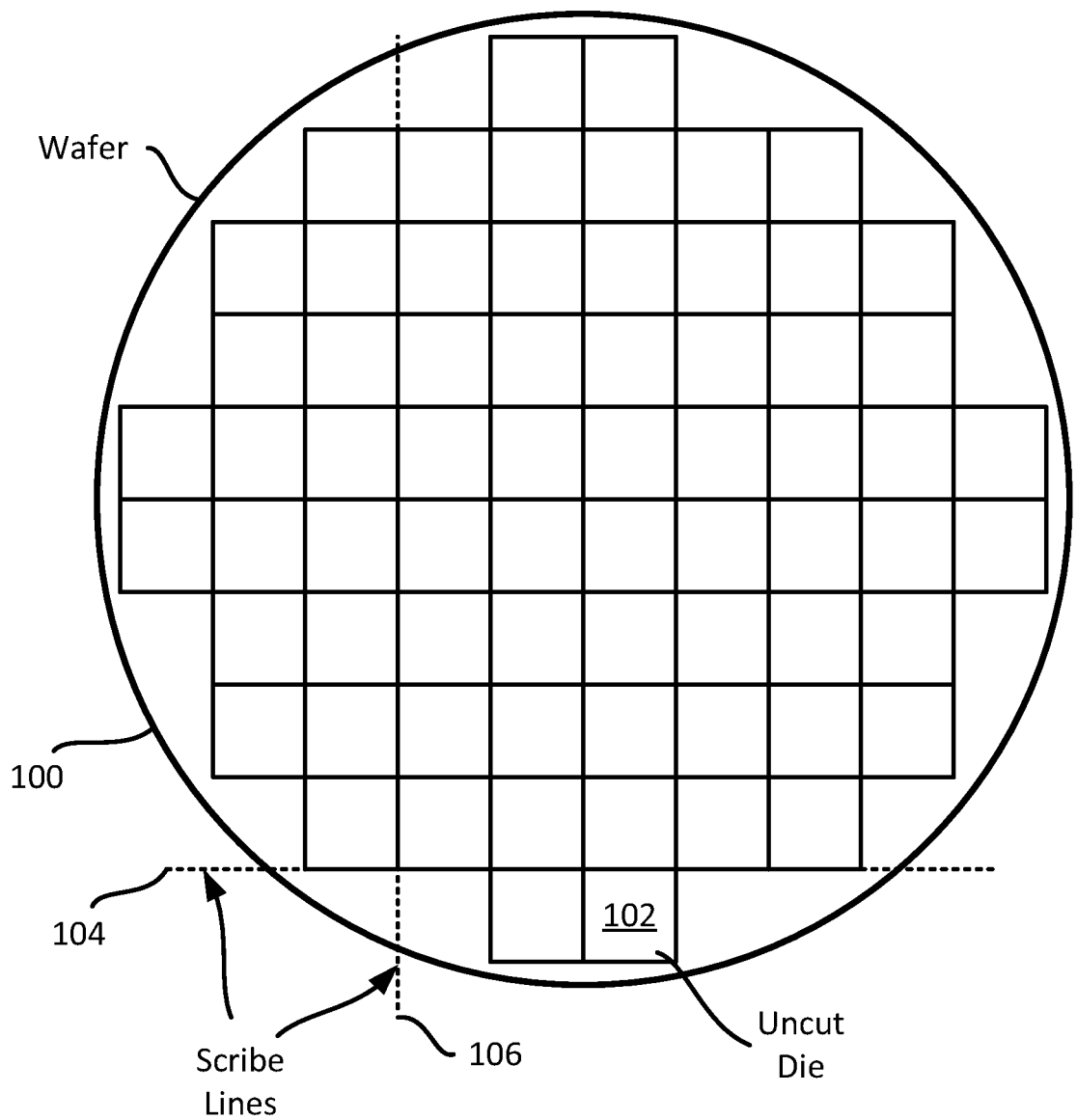
FIG. 1 illustrates a wafer that includes uncut dies.
Figure 2:
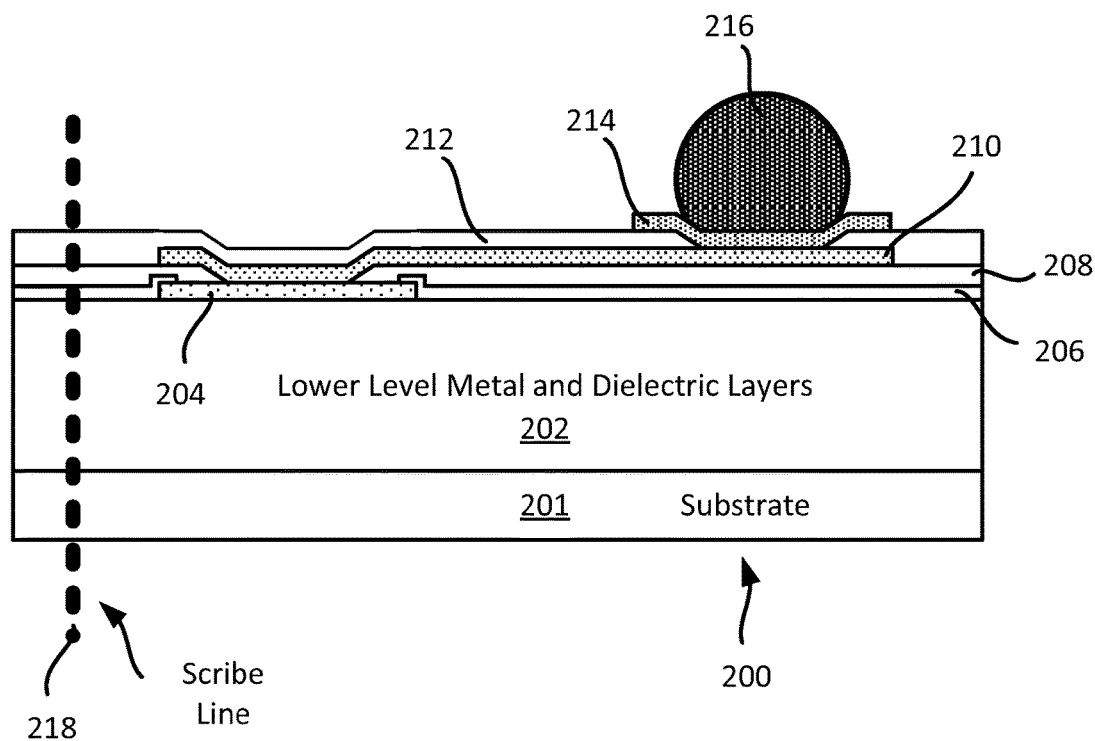
FIG. 2 illustrates a side view of a die.
Figure 3:
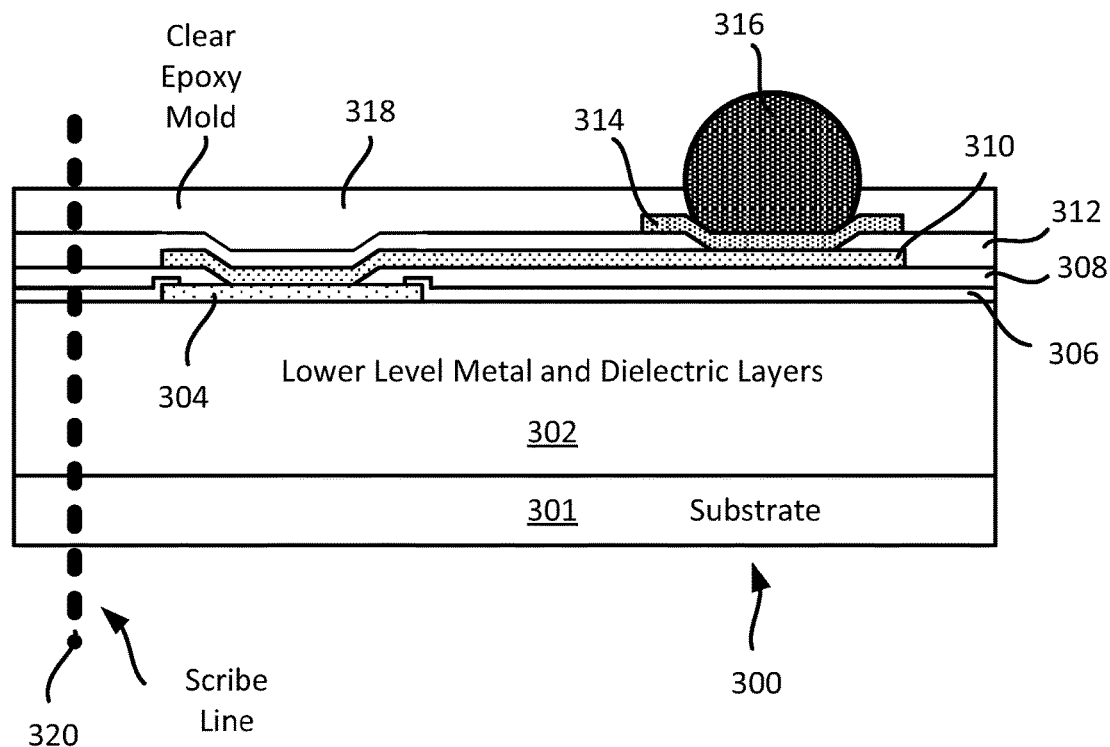
FIG. 3 illustrates an example of a die that includes a mold layer that provides top side and sidewall protection.

FIG. 3 illustrates a side view of a wafer that includes a protective layer that protects a die from cracking/chipping. Specifically, FIG. 3 illustrates a side view of a portion of a wafer 300. The wafer 300 includes a substrate 301, several metal and dielectric layers 302, a pad 304, a passivation layer 306, a first insulation layer 308, a first metal redistribution layer 310, a second insulation layer 312, an under bump metallization (UBM) layer 314, and a mold layer 318. FIG. 3 also illustrates a solder ball 316 on the wafer 300. Specifically, the solder ball 316 is coupled to the UBM layer 314. The pad 304, the first metal redistribution layer 310 and the UBM layer 314 are a conductive material (e.g., copper). The first insulation layer 308 and the second insulation layer 312 may be polyimide layers. In some implementations, the first insulation layer 308 and the second insulation layer 312 may be Polybenzoxazole (PbO) layers and/or polymer layers.

In some implementations, the mold layer 318 is made of an epoxy. In some implementations, the mold layer 318 is made of a clear epoxy. In some implementations, a clear epoxy is an epoxy that allows light to traverse (e.g., substantially traverse, more than 50 percent) through the epoxy. In some implementations, a clear epoxy is a transparent epoxy. In some implementation, the epoxy may be an opaque epoxy. An opaque epoxy may be an epoxy that allows some light to traverse (e.g., less than 50 percent) through the epoxy in some implementations. In some implementations, the mold layer 318 provides structural and mechanical stability to the die when the wafer is cut. In addition, providing a clear epoxy allows a machine that guides the saw to "see" through the epoxy (e.g., mold layer 318) when cutting the die, which can reduce the cost of manufacturing the die, in some implementations.

FIG. 3 also illustrates a region of the wafer 300 that will be cut to create individual dies. This region of the wafer 300 is illustrated by the scribe line 320. The scribe line 320 may be a region of the wafer 300 that does not include any circuits. In some implementations, once the wafer 300 is cut along one or more scribe lines (e.g., scribe line 320), a die that includes a mold configured to provide top side and sidewall protection is provided/manufactured.

Figure 4:
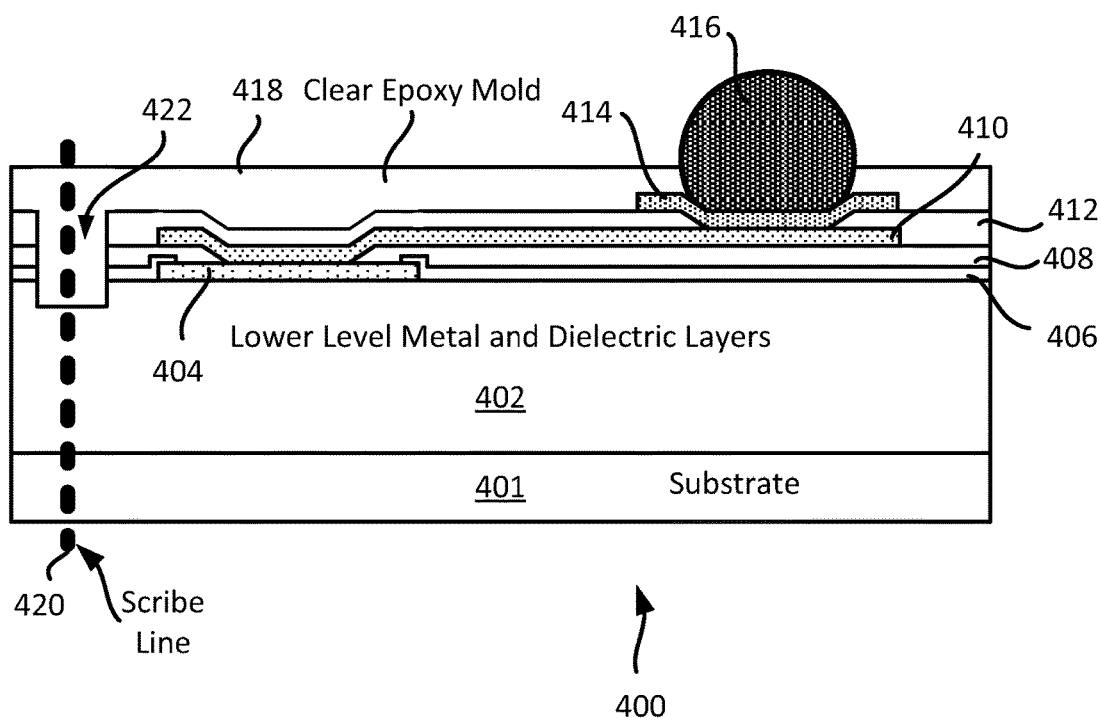
FIG. 4 illustrates another example of a die that includes a mold layer that provides top side and sidewall protection.

FIG. 4 illustrates another side view of a wafer that includes a protective layer that protects a die from cracking/chipping. In some implementations, the protective layer is made of a material that improves/enhances the structural and mechanical stability of the wafer or the die. For example, a protective layer that is made of a material that is less brittle than some of the low K (LK) dielectrics, extremely low K (ELK), or ultra low K (ULK) dielectrics in the wafer/die, would provide the wafer/die with additional structure, rigidity and mechanical stability to absorb some of the stress (e.g., thermal stress, mechanical stress) that the wafer/die is subject to during the manufacturing of the die (e.g., during the cutting of the wafer into singular dies). Thus, adding the protective layer (e.g., mold layer), which is less brittle than some or all of the dielectrics increases the amount of stress (e.g., thermal stress, mechanical stress) that wafer or die can absorb, thus decreasing the likelihood of the die cracking/chipping.

FIG. 4 is similar to FIG. 3, except that the wafer includes a cavity/trench region. Specifically, FIG. 4 illustrates a side view of a portion of a wafer 400. The wafer 400 includes a substrate 401, several metal and dielectric layers 402, a pad 404, a passivation layer 406, a first insulation layer 408, a first metal redistribution layer 410, a second insulation layer 412, an under bump metallization (UBM) layer 414, and a mold layer 418. The metal and dielectric layer 402 may include lower level metal layers (e.g., M1 metal layer, M2 metal layer, M3 metal layer, M4 metal layer, M5 metal layer, M6 metal layer, M7 metal layer). FIG. 4 also illustrates a solder ball 416 on the wafer 400. Specifically, the solder ball 316 is coupled to the UBM layer 414. The pad 404, the first metal redistribution layer 410 and the UBM layer 414 are a conductive material (e.g., copper). The first insulation layer 408 and the second insulation layer 412 may be polyimide layers. In some implementations, the first insulation layer 408 and the second insulation layer 412 may be Polybenzoxazole (PbO) layers and/or polymer layers.

In some implementations, the mold layer 418 is made of an epoxy. In some implementations, the mold layer 418 is made of a clear epoxy. As further shown in FIG. 4, the mold layer 418 includes a mold region 422 (e.g., cavity/trench filled with the mold layer). In some implementations, the cavity/trench may have different shapes. The cavity/trench may have fill in functionality. That is, the cavity/trench may be configured to be filled with a mold layer 418 in some implementations. In some implementations, the mold region 422 may have different shapes (e.g., the cavity/trench filled with the mold layer may have different shapes). The region 422 of the mold layer 418 traverses the second insulation 412, the first insulation layer 408, the passivation layer 406 and one or more of the metal and dielectric layers 402.

Although not shown in FIG. 4, in some implementations, the region 422 may traverse the entire metal and dielectric layers 402. In some implementations, the mold layer 418 provides structural and mechanical stability to the die when the wafer is cut, thus reducing the likelihood of chipping/cracking of the die. In some implementations, this is because the region 422 of the mold layer 418 is made of a material that is less brittle than some of the other materials of the die (e.g., metal and dielectric layer 402). In some implementations, this additional region 422 of the mold layer 418 helps the die absorb the stress (e.g., thermal stress, mechanical stress) that may occur during the manufacturing of the die, thus preventing chipping/cracking of the die. In addition, providing a clear epoxy allows a machine that guides the saw to "see" through the epoxy (e.g., mold layer 418) when cutting the die, which may help reduce the cost of manufacturing a die in some implementations.

FIG. 4 also illustrates a region of the wafer 400 that will be cut to create individual dies. This region of the wafer 400 is illustrated by the scribe line 420. In some implementations, the scribe line 420 is aligned with the region 422 of the mold layer 418. The scribe line 420 may be a region of the wafer 400 that does not include any circuits. In some implementations, once the wafer 400 is cut along one or more scribe lines (e.g., scribe line 420), a die that includes a mold configured for top side and sidewall protection is provided/manufactured.

It should be noted that FIGS. 3-4 illustrate an example of a semiconductor device (e.g., wafer) that includes a mold layer for top side and sidewall protection. In some implementations, a semiconductor device may include a wafer, a die, a die package, an integrated circuit (IC), and/or an interposer. In some implementations, the interposer may be an active interposer that includes active circuit elements. Thus, the mold layer and/or the mold region that is configured to provide top side and sidewall protection in FIGS. 3-4, may also be used in other types of semiconductor devices, and is not limited to wafers and dies.

Having described a wafer that can be cut into a die that includes a mold layer and/or a mold region configured to provide top side and sidewall protection, a sequence for providing/manufacturing such a die will now be described below.

Exemplary Sequence for Providing/Manufacturing a Die that Includes a Mold Layer for Top Side and Sidewall Protection In some implementations, cutting a wafer into individual dies (e.g., single die) includes several processes. FIGS. 5A-5E illustrate an exemplary sequence for cutting a wafer into individual dies (e.g., singular dies). In some implementations, the sequence of FIGS. 5A-5E may be used to provide/manufacture the die of FIGS. 3, 4 or other dies described in the present disclose. It should also be noted that the sequence of FIGS. 5A-5E may be used to provide/manufacture other semiconductor devices (e.g., interposer). In some implementations, such a manufactured interposer may includes circuit elements.

Figure 5A:
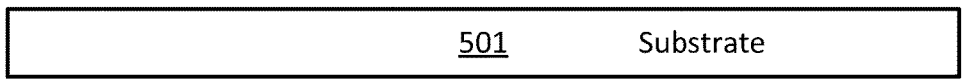
FIG. 5A illustrates part of an exemplary sequence for providing/manufacturing a die that includes a mold layer that provides top side and sidewall protection.
Figure 5A:
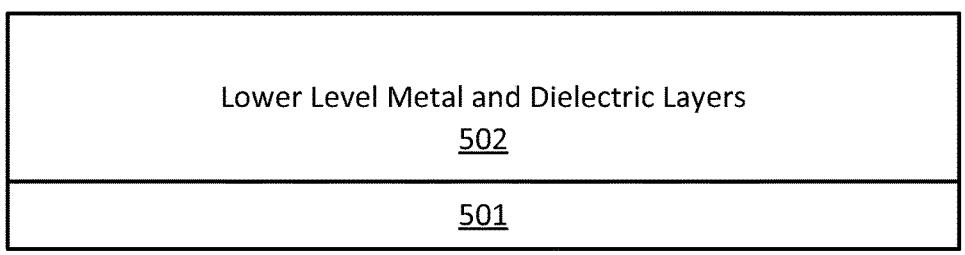
Figure 5A:
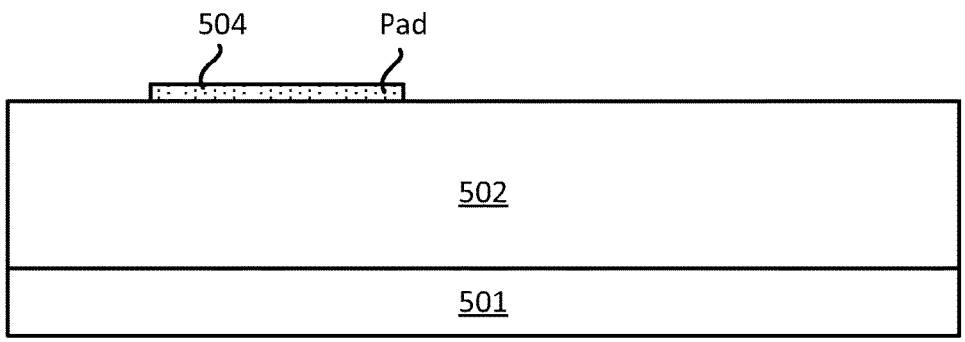
Figure 5A:
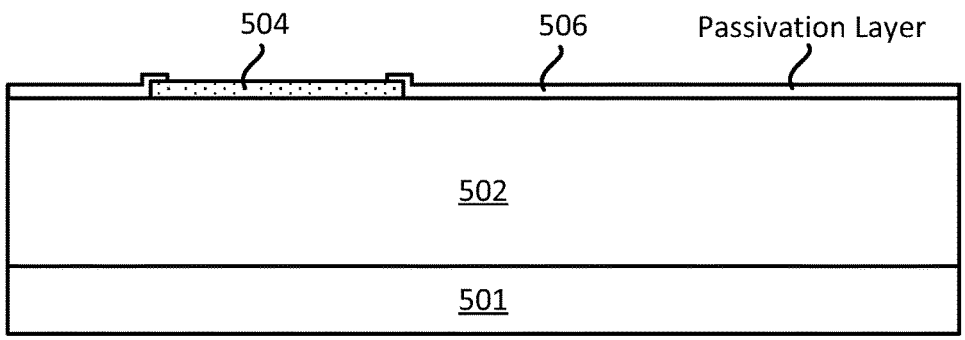

As shown in stage 1 of FIG. 5A, a substrate (e.g., substrate 501) is provided. In some implementations, the substrate is a wafer. Different implementations may use different materials for the substrate (e.g., silicon substrate, glass substrate).

At stage 2, several lower level metal and dielectric layers (e.g., lower level metal and dielectric layers 502) are provided on the substrate. Different implementations, may provide different number of lower level metal and dielectric layers (e.g., M1 metal layer, M2 metal layer, M3 metal layer, M4 metal layer, M5 metal layer, M6 metal layer, M7 metal layer).

At stage 3, at least one pad (e.g., pad 504) is provided on the lower level metal and dielectric layers 502. In some implementations, the pad is coupled to one of the lower level metal layer (e.g., the top lower level metal layer, M7 metal layer). In some implementations, the pad 504 is an aluminum pad. However, different implementations may use different materials for the pad 504. Different implementations may use different processes for providing the pad on the lower level metal and dielectric layers 502. For example, in some implementations, a lithography and/or etching process may be use to provide the pad 504 on the lower level metal and dielectric layers 502.

At stage 4, a passivation layer (e.g., passivation layer 506) is provided on the lower level metal and dielectric layers 502. Different implementations may use different materials for the passivation layer. As shown in stage 4, the passivation layer 406 is provided on the lower level metal and dielectric layers 502 such that at least a portion of the pad 504 is exposed.

Figure 5B:
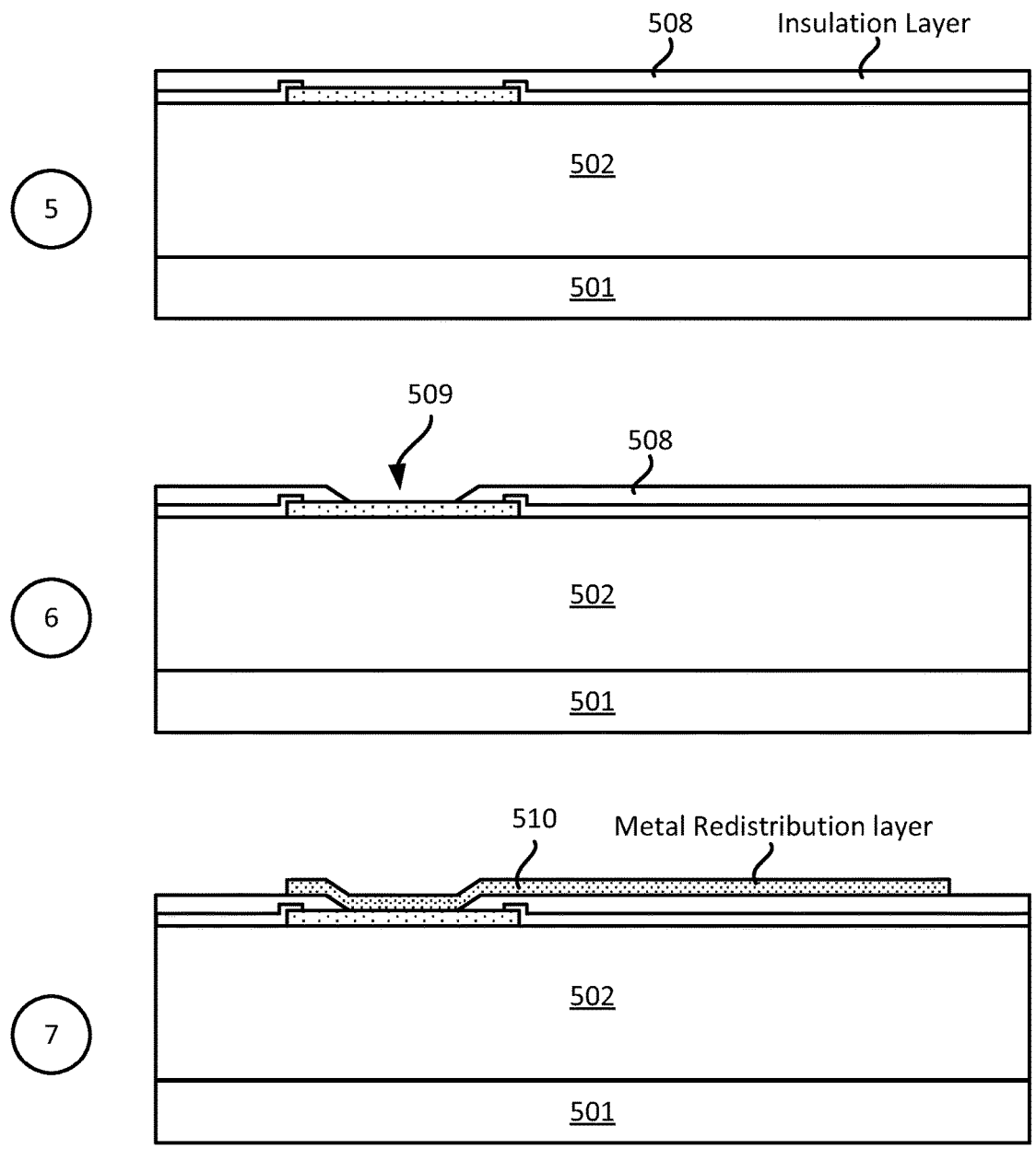
FIG. 5B illustrates part of an exemplary sequence for providing/manufacturing a die that includes a mold layer that provides top side and sidewall protection.

At stage 5 of FIG. 5B, a first insulation layer (e.g., first insulation layer 508) is provided on the passivation layer 506 and the pad 504. Different implementations may use different materials for the first insulation layer 508. For example, the first insulation layer 508 may be a Polybenzoxazole (PbO) layer or a polymer layer.

At stage 6, a cavity (e.g., cavity 509) is provided/created in the first insulation layer 508. As further shown in stage 6, the cavity 509 is created over the pad 504. Different implementations may create the cavity 509 differently. For example, the cavity 509 may be provided/created by etching the first insulation layer 508.

At stage 7, a first metal redistribution layer is provided. Specifically, a first metal redistribution layer 510 is provided over the pad 504 and the first insulation layer 508. As shown in stage 7, the first metal redistribution layer 510 is coupled to the pad 504. In some implementations, the first metal redistribution layer 510 is a copper layer.

Figure 5C:
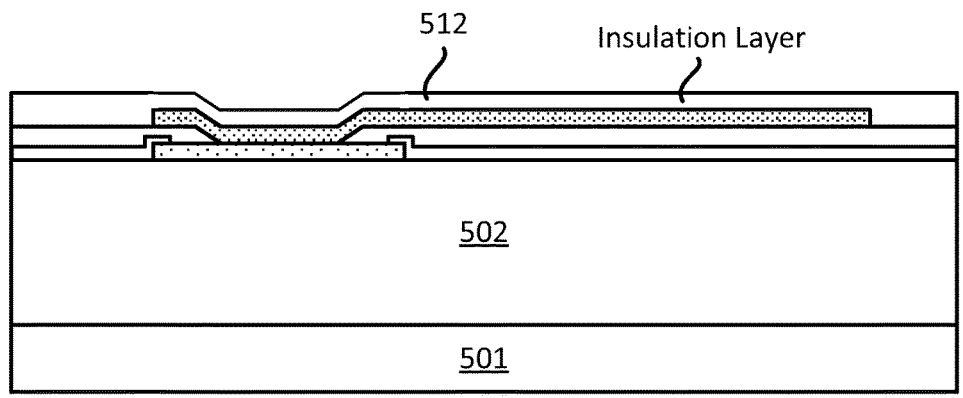
FIG. 5C illustrates part of an exemplary sequence for providing/manufacturing a die that includes a mold layer that provides top side and sidewall protection.
Figure 5C:
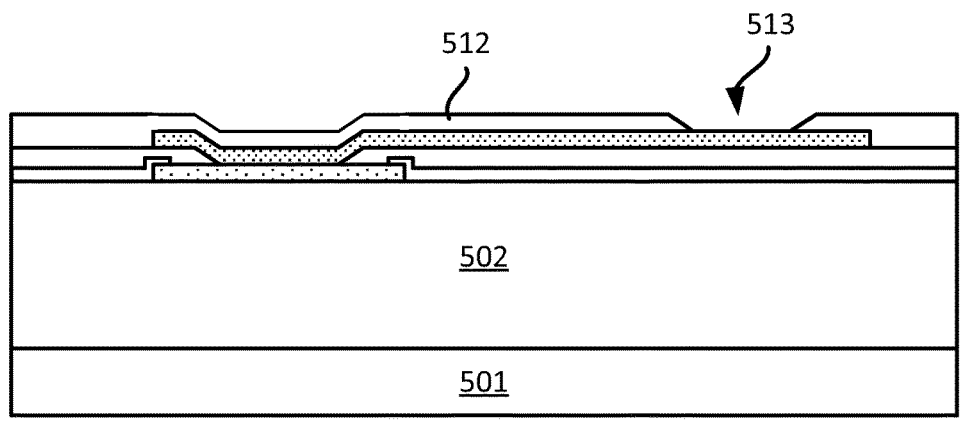
Figure 5C:
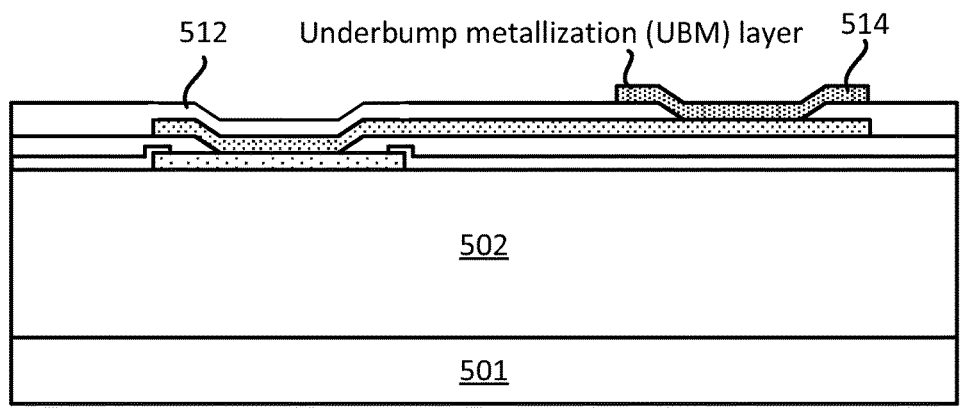

At stage 8 of FIG. 5C, a second insulation layer (e.g., second insulation layer 512) is provided on the first insulation layer 508 and the first metal redistribution layer 510. Different implementations may use different materials for the second insulation layer 512. For example, the second insulation layer 512 may be a Polybenzoxazole (PbO) layer or a polymer layer.

At stage 9, a cavity (e.g., cavity 513) is provided/created in the second insulation layer 512. Different implementations may create the cavity 513 differently. For example, the cavity 513 may be provided/created by etching the second insulation layer 512.

At stage 10, an under bump metallization (UBM) layer is provided. Specifically, an under bump metallization (UBM) layer 514 is provided in the cavity 513 of the second insulation layer 512. As shown at stage 10, the UBM layer 514 is coupled to the first metal redistribution layer 510. In some implementations, the UBM layer 514 is a copper layer.

At stage 11, a solder ball is provided on the UBM layer. Specifically, a solder ball 516 is coupled to the UBM layer 514.

At stage 12, a cavity is provided/created in the wafer. Specifically, a cavity 522 is created in the second insulation layer 512, the first insulation layer 508, the second insulation layer 506, and at least one of the lower level metal and dielectric layers 502. Different implementations may have cavities and/or trenches with different shapes. As further shown in stage 12, the cavity 522 is provided/created along a scribe line (e.g., scribe line 520). As previously described above, a scribe line is a region of a wafer that will be cut in order to provide/manufacture one or more dies. Different implementations may use different processes for providing/creating the cavity/trench. For example, a laser may be use to create the cavity 522. In such instances, several passes of a laser may be use to create the cavity 522. Examples of a laser process for creating one or more cavities in a wafer (e.g., cavity 522) will be further described in FIGS. 6 and 7. It should also be noted that the cavity along the scribe line may traverse different parts of the wafer in different implementations. That is, in some implementations, the cavity (e.g., cavity 522) along a scribe line may have different depths. Other examples of cavities along a scribe line are further described in FIGS. 9-11.

Figure 5D:
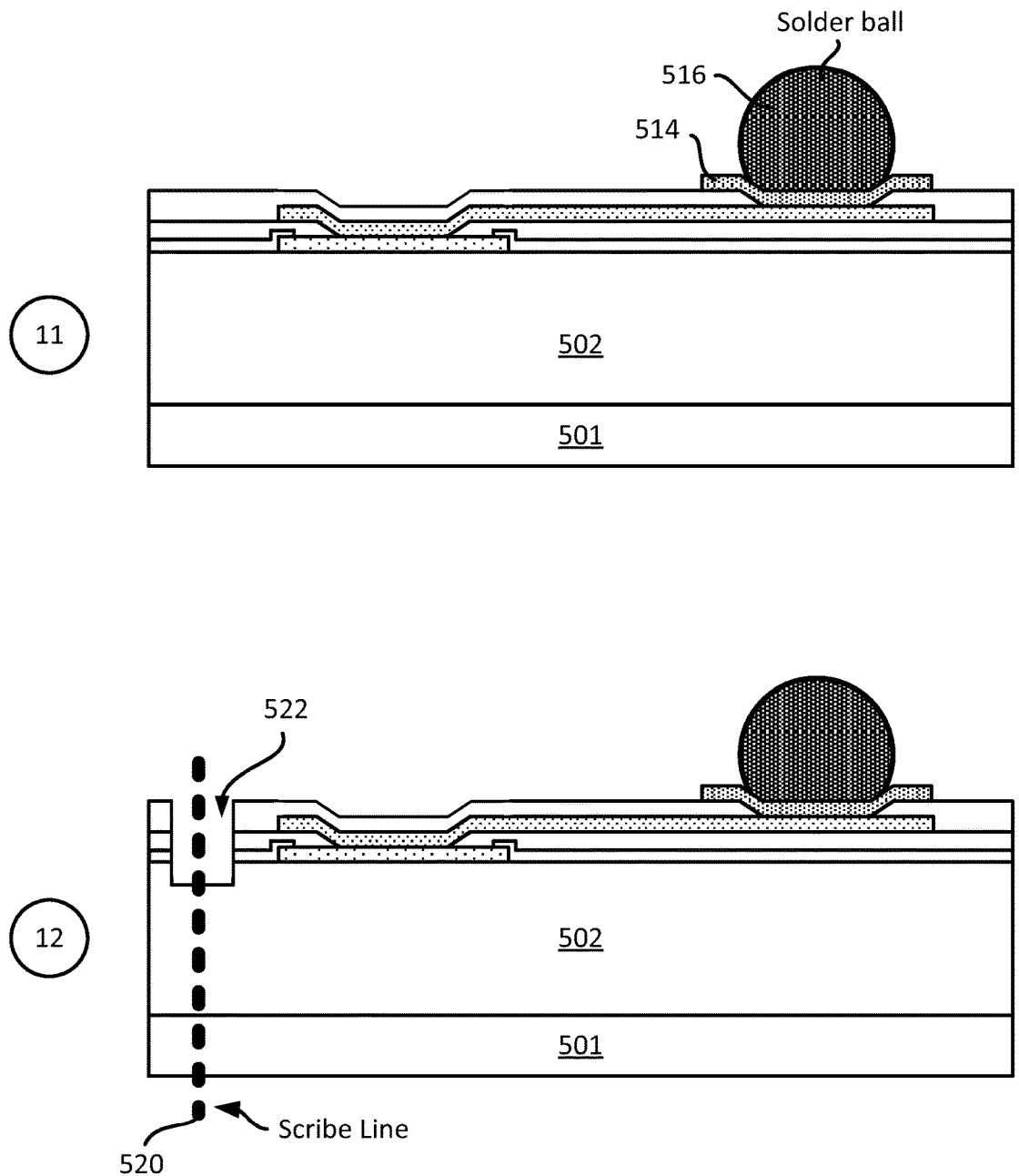
FIG. 5D illustrates part of an exemplary sequence for providing/manufacturing a die that includes a mold layer that provides top side and sidewall protection.
Figure 5E:
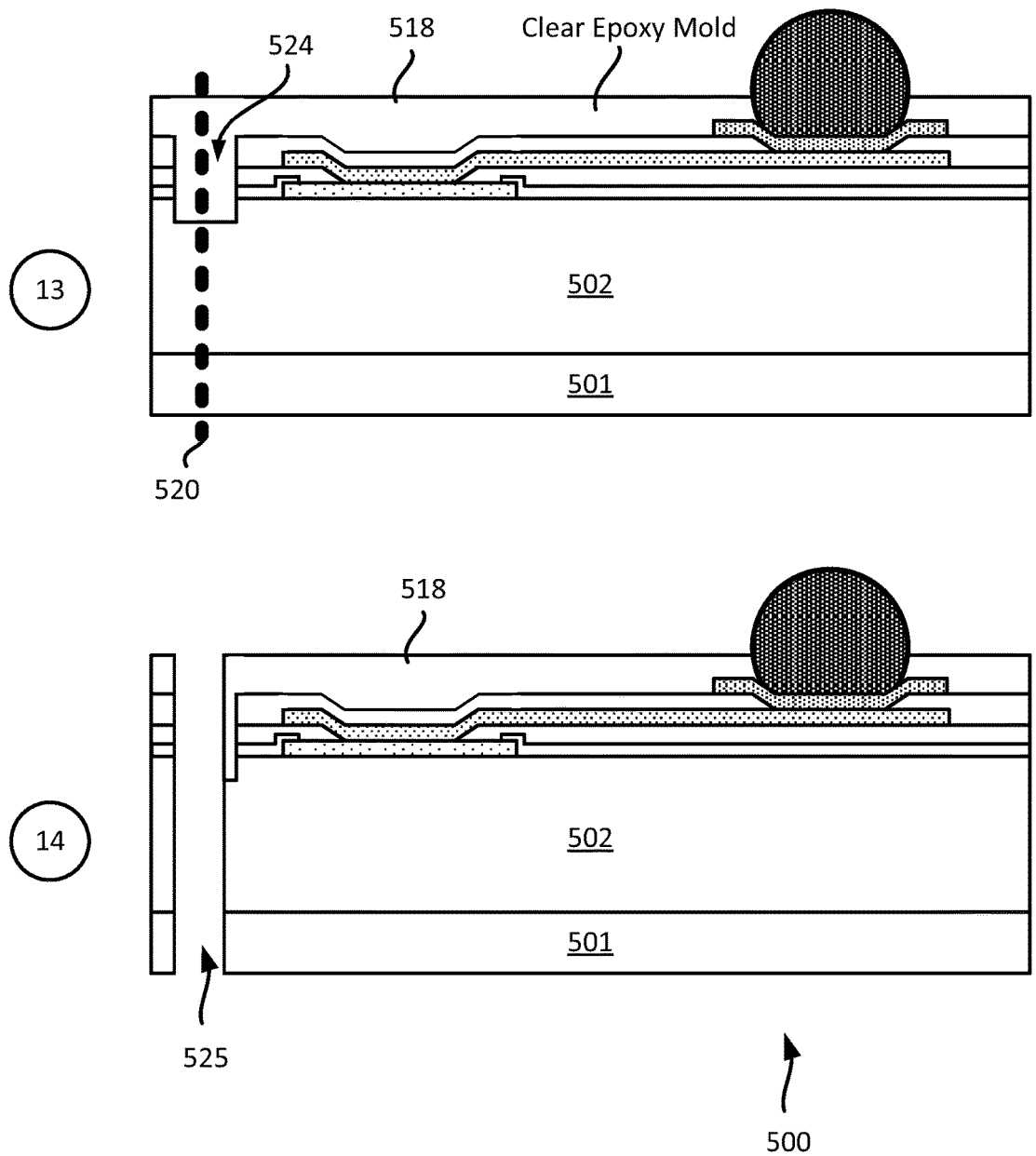
FIG. 5E illustrates part of an exemplary sequence for providing/manufacturing a die that includes a mold layer that provides top side and sidewall protection.

At stage 13 of FIG. 5E, a mold layer is provided on the wafer. Specifically, a mold layer 518 is provided on the wafer. In some implementations, the mold layer 518 is an epoxy (e.g., clear epoxy). When the mold layer 518 is provided on the wafer, the cavity 522 is filled with the mold material, which forms a mold region 524 that may represent the scribe line 520 in some implementations. Different implementations may have a mold region 524 with different depths along the die, which is further described in FIGS. 9-11.

As shown in stage 14, a saw (not shown) is used to cut the portion of the wafer along the mold region 524 (e.g., along the scribe line 520). In some implementations, the saw (not shown) cuts through the mold layer 518, the second insulation layer 512, the first insulation layer 508, the passivation layer 506, the metal and dielectric layers 502, and the substrate 501, along the mold region 524 (e.g., scribe line 520), creating a cavity/separation 525. In some implementations, using the saw to cut the wafer creates an individual/singular die 500.

Stage 14 also illustrates that after the cutting of the saw along the scribe line 520, some portion of the mold layer 518 covers the side of the die 500. Specifically, in some implementations, the mold layer 518 covers a portion of side of the second insulation layer 512, the first insulation layer 508, the passivation layer 506, and at least one of the lower level metal and dielectric layers 502 (e.g., M7 metal layer). In some implementations, the mold layer 518 and/or mold region 524 may cover some or the entire lower level metal and dielectric layers 502.

In some implementations, providing the mold layer 518 and mold region 524 (e.g., on top of the die and/or the sidewall of the die) enhances the structural and mechanical stability of the wafer or die, which results in a reduction in the likelihood of chipping and/or cracking of the die during the cutting process.

Exemplary Sequences for Providing/Creating Cavity Aligned with Scribe Line on a Wafer As described above, in some implementations, cutting a wafer into individual dies (e.g., single die) includes several processes. One such process is the creating of a cavity along a scribe line. Stage 12 of FIG. 5D illustrates an example of providing/creating such a cavity. As described in stage 12 of FIG. 5D, a laser may be used to create the cavity. Different implementations may create/manufacture cavities with different shapes and/or depths.

Figure 6:
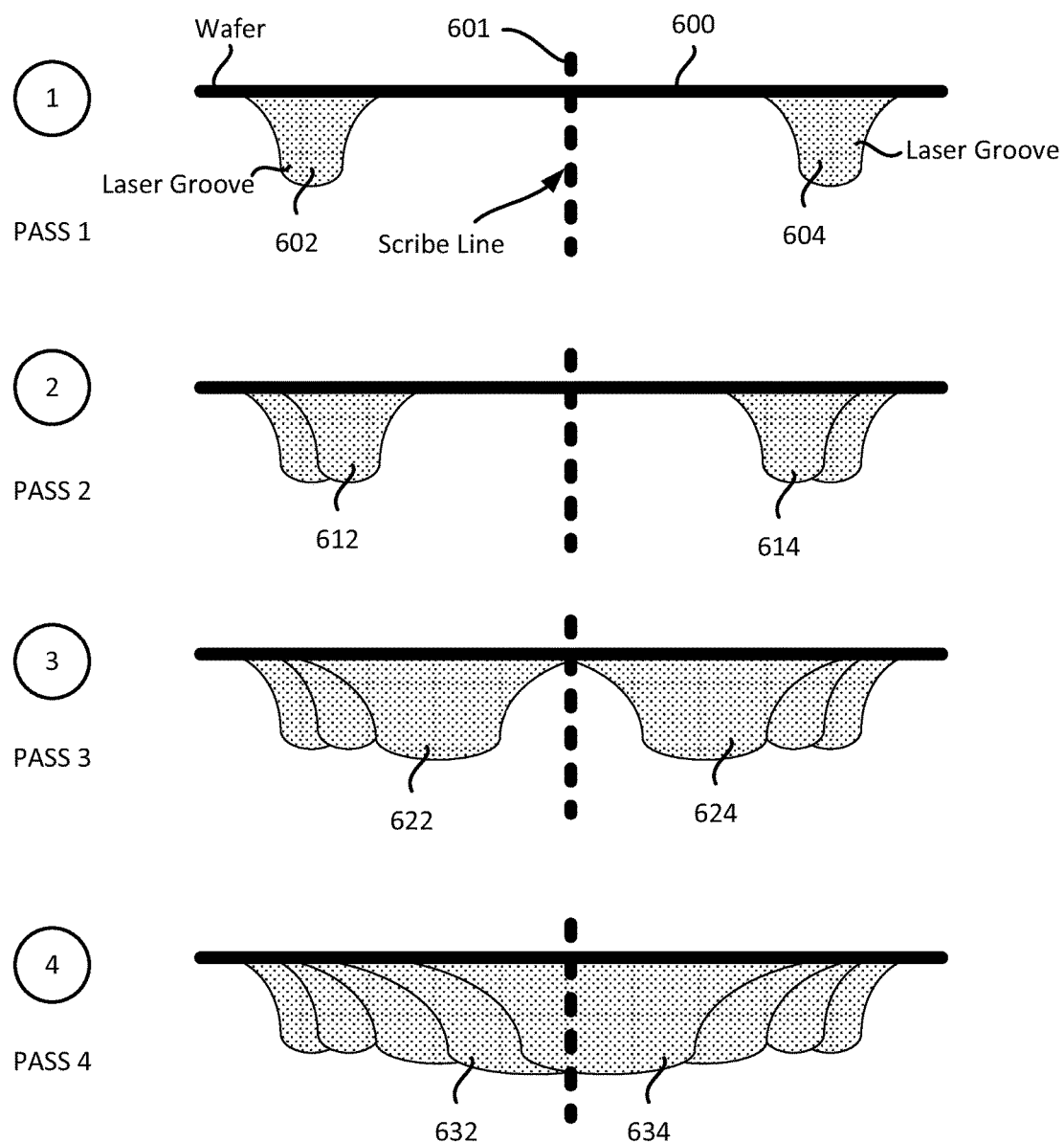
FIG. 6 illustrates an exemplary sequence of a four pass laser sequence on a wafer.
Figure 7:
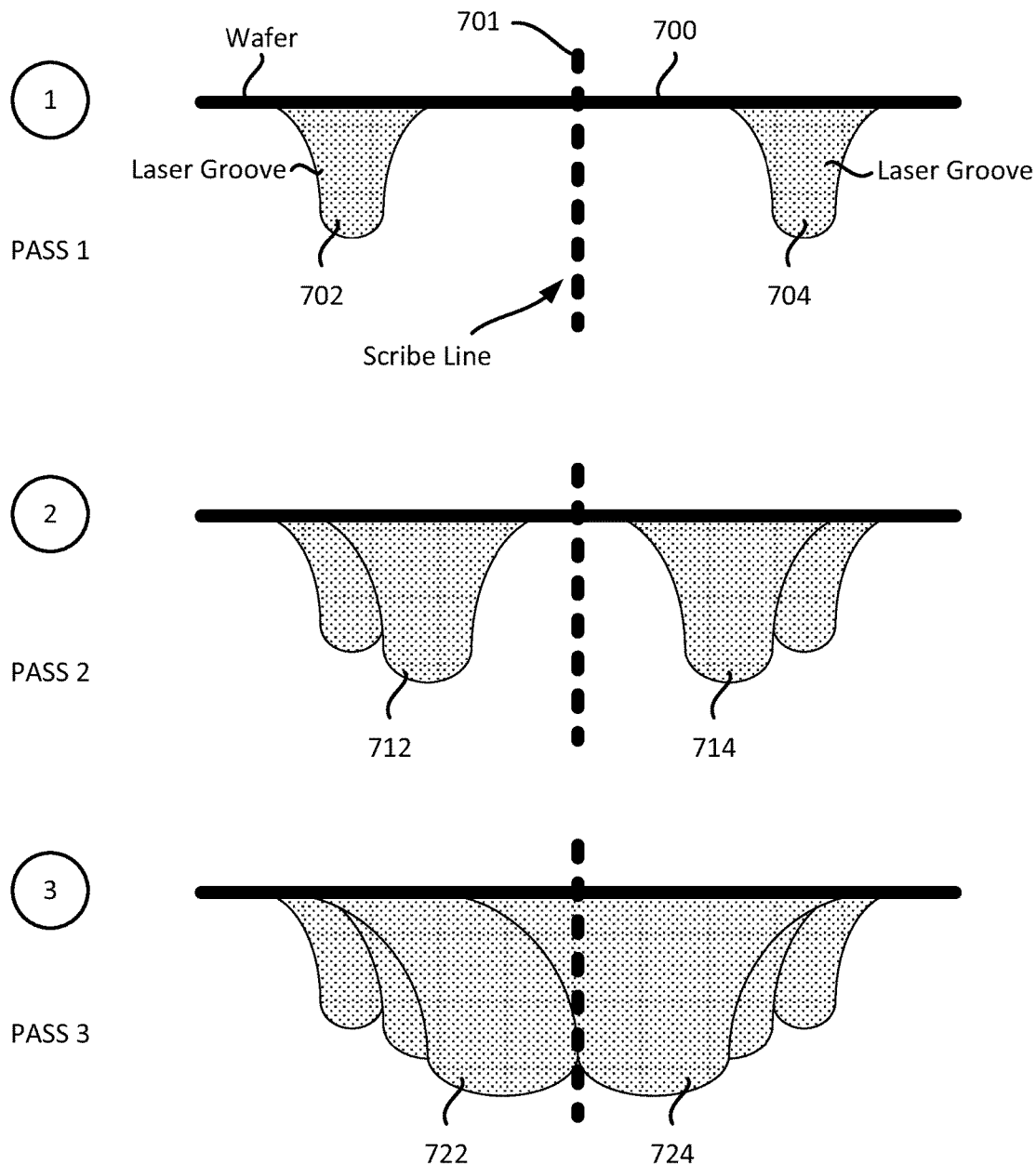
FIG. 7 illustrates an exemplary sequence of a three pass laser sequence on a wafer.

FIGS. 6-7 illustrate exemplary sequences for providing/creating a cavity in a wafer. In some implementations, the cavity that is created by the laser is filled with a mold/mold layer (e.g., epoxy material). Specifically, FIG. 6 illustrates a four pass sequence for creating a cavity on a wafer, while FIG. 7 illustrates a three pass sequence for creating a cavity on a wafer.

As shown in stage 1 of FIG. 6, a first laser groove 602 and a second laser groove 604 are created in the wafer 600. Stage 1 may be referred to as a first laser pass. The first laser groove 602 and the second laser groove 604 are created along the scribe line 601. The first laser groove 602 and the second laser groove 604 may be created at the same time or sequentially. In some implementations, one or more lasers at a first setting is use to create the first and second laser grooves 602-604, which may be cavities and/or trenches in the wafer. In some implementations, the laser grooves 602-604 may traverse one or more of a second insulation layer, a first insulation layer, a passivation layer, and at least one of the lower level metal and dielectric layers.

At stage 2 of FIG. 6, a third laser groove 612 and a fourth laser groove 614 are created in the wafer 600. Stage 2 may be referred to as a second laser pass. The third laser groove 612 and the fourth laser groove 614 are created along the scribe line 601. The third laser groove 612 and the fourth laser groove 614 may be created at the same time or sequentially. In some implementations, one or more lasers at a second setting (e.g., second setting that is higher/more powerful than the first setting) is use to create the third and fourth laser grooves 612-614, which may be cavities and/or trenches in the wafer. In some implementations, the laser grooves 612-614 may traverse one or more of a second insulation layer, a first insulation layer, a passivation layer, and at least one of the lower level metal and dielectric layers.

At stage 3 of FIG. 6, a fifth laser groove 622 and a sixth laser groove 624 are created in the wafer 600. Stage 3 may be referred to as a third laser pass. The fifth laser groove 622 and the sixth laser groove 624 are created along the scribe line 601. The fifth laser groove 622 and the sixth laser groove 624 may be created at the same time or sequentially. In some implementations, one or more lasers at a third setting (e.g., third setting that is higher/more powerful than the second setting) is use to create the fifth and sixth laser grooves 622-624, which may be cavities and/or trenches in the wafer. In some implementations, the laser grooves 622-624 may traverse one or more of a second insulation layer, a first insulation layer, a passivation layer, and at least one of the lower level metal and dielectric layers.

At stage 4 of FIG. 6, a seventh laser groove 632 and a eighth laser groove 634 are created in the wafer 600. Stage 4 may be referred to as a fourth laser pass. The seventh laser groove 632 and the eighth laser groove 634 are created along the scribe line 601. The seventh laser groove 632 and the eighth laser groove 634 may be created at the same time or sequentially. In some implementations, one or more lasers at a fourth setting (e.g., fourth setting that is higher/more powerful than the third setting) is use to create the seventh and eighth laser grooves 632-634, which may be cavities and/or trenches in the wafer. In some implementations, the laser grooves 632-634 may traverse one or more of a second insulation layer, a first insulation layer, a passivation layer, and at least one of the lower level metal and dielectric layers.

In some implementations, the laser grooves 602-634 may define/create the cavity 522 of FIG. 5D. The laser grooves 602-634 may also define/create a cavity which may be filled with a mold material and which forms mold region 922 of FIG. 9, a cavity which may be filled with a mold material and which forms mold region 1022 of FIG. 10, and/or a cavity which may be filled with a mold material and which forms mold region 1122 of FIG. 11. These cavities which may be filled with a mold material will be further described below.

In some implementations, instead of a four pass laser sequence, a three pass laser sequence may be use to provide/create a cavity in a wafer. As mentioned above, FIG. 7 illustrates an example of such a three pass laser sequence.

As shown in stage 1 of FIG. 7, a first laser groove 702 and a second laser groove 704 are created in the wafer 700. Stage 1 may be referred to as a first laser pass. The first laser groove 702 and the second laser groove 704 are created along the scribe line 701. The first laser groove 702 and the second laser groove 704 may be created at the same time or sequentially. In some implementations, one or more lasers at a first setting is use to create the first and second laser grooves 702-704, which may be cavities and/or trenches in the wafer. In some implementations, the laser grooves 702-704 may traverse one or more of a second insulation layer, a first insulation layer, a passivation layer, and at least one of the lower level metal and dielectric layers.

At stage 2 of FIG. 7, a third laser groove 712 and a fourth laser groove 714 are created in the wafer 700. Stage 2 may be referred to as a second laser pass. The third laser groove 712 and the fourth laser groove 714 are created along the scribe line 701. The third laser groove 712 and the fourth laser groove 714 may be created at the same time or sequentially. In some implementations, one or more lasers at a second setting (e.g., second setting that is higher/more powerful than the first setting) is use to create the third and fourth laser grooves 712-714, which may be cavities and/or trenches in the wafer. In some implementations, the laser grooves 712-714 may traverse one or more of a second insulation layer, a first insulation layer, a passivation layer, and at least one of the lower level metal and dielectric layers.

At stage 3 of FIG. 7, a fifth laser groove 722 and a sixth laser groove 724 are created in the wafer 700. Stage 3 may be referred to as a third laser pass. The fifth laser groove 722 and the sixth laser groove 724 are created along the scribe line 701. The fifth laser groove 722 and the sixth laser groove 724 may be created at the same time or sequentially. In some implementations, one or more lasers at a third setting (e.g., third setting that is higher/more powerful than the second setting) is use to create the fifth and sixth laser grooves 722-724, which may be cavities and/or trenches in the wafer. In some implementations, the laser grooves 722-724 may traverse one or more of a second insulation layer, a first insulation layer, a passivation layer, and at least one of the lower level metal and dielectric layers.

In some implementations, the laser grooves 702-724 may define/create the cavity 522 of FIG. 5D. The laser grooves 702-724 may also define/create a cavity which may be filled with a mold material and which forms mold region 922 of FIG. 9, a cavity which may be filled with a mold material and which forms mold region 1022 of FIG. 10, and/or a cavity which may be filled with a mold material and which forms mold region 1122 of FIG. 11. These cavities which may be filled with a mold material will be further described below.

Having described a sequence for providing/manufacturing a die that includes a mold layer and/or mold region for top side and sidewall protection, a method for providing/manufacturing a die that includes a mold layer and/or mold region for top side and sidewall protection will now be described below.

Figure 8:
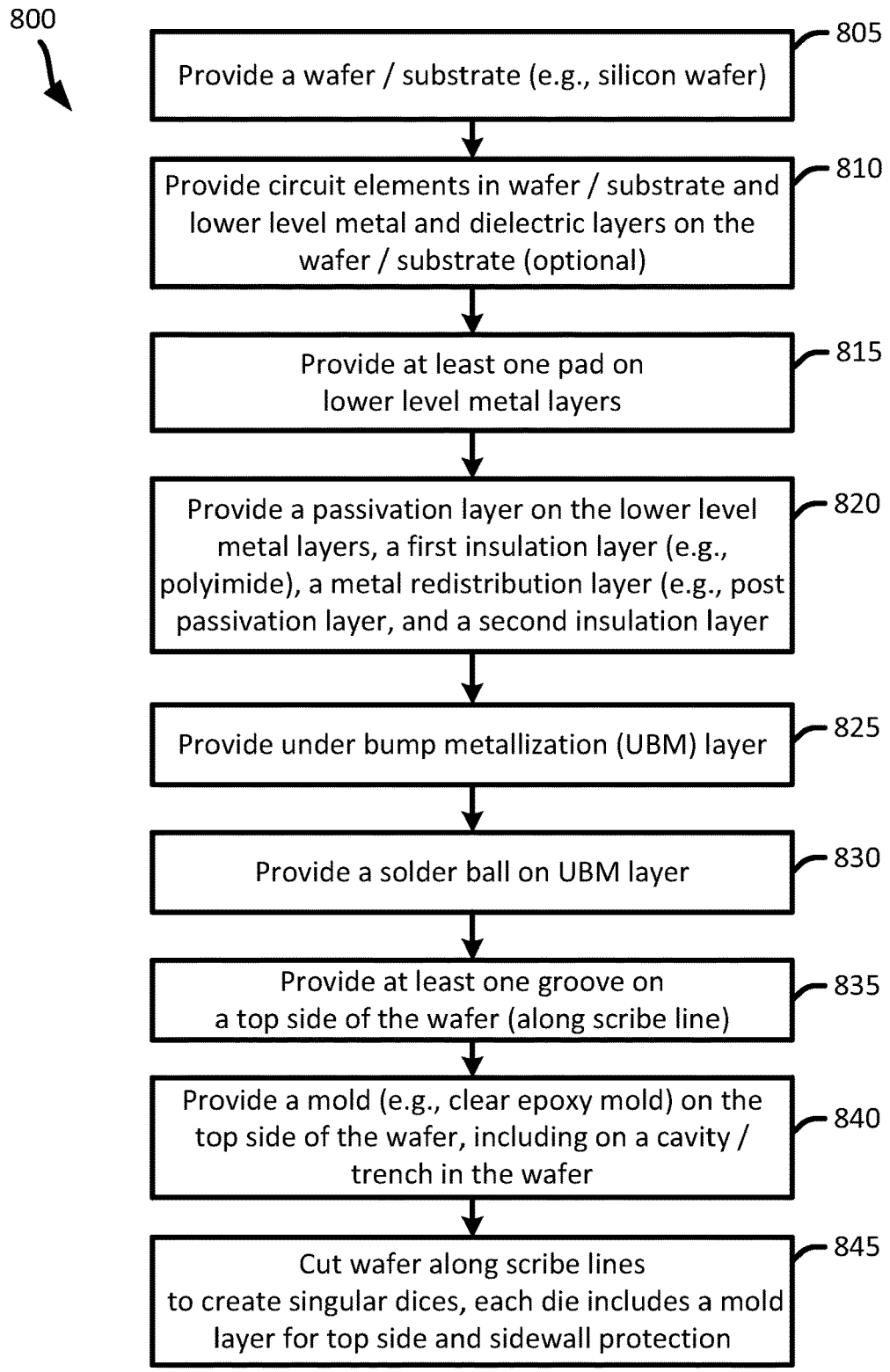
FIG. 8 illustrates an exemplary method for providing/manufacturing a die that includes a mold layer that provides top side and sidewall protection.

Exemplary Method for Providing/Manufacturing a Die that Includes a Mold Layer for Top Side and Sidewall Protection As described above, in some implementations, cutting a wafer into individual dies (e.g., single die) includes several processes. FIG. 8 illustrates an exemplary method for cutting a wafer into individual dies (e.g., singular dies). In some implementations, the method of FIG. 8 may be used to provide/manufacture the die of FIGS. 3, 4 or other dies described in the present disclose.

The method provides (at 805) a substrate (e.g., substrate 501). In some implementations, providing (at 805) the substrate includes providing a wafer (e.g., silicon wafer). However, different implementations may use different materials for the substrate (e.g., glass substrate). The method then optionally provides (at 810) circuit elements in the substrate and several lower level metal and dielectric layers on the substrate. Different implementations may provide different number of lower level metal and dielectric layers (e.g., M1-M7 metal layers). In some implementations, providing (at 810) the circuit elements may be bypassed. For example, when an interposer is manufactured from a substrate/wafer, some implementations may skip providing circuit elements (e.g., skip manufacturing active circuit elements). As such, some implementations may provide the lower level and dielectric layer but not the circuit elements. However, it should be noted that in some implementations, an interposer may include active circuit elements.

The method further provides (at 815) at least one pad (e.g., pad 504) on one of the lower level metal and dielectric layers (e.g., M7 metal layer). In some implementations, providing (at 815) the pad includes coupling the pad to one of the lower level metal layer (e.g., the top lower level metal layer, M7 metal layer). In some implementations, the pad is an aluminum pad. However, different implementations may use different materials for the pad. In addition, different implementations may use different processes for providing the pad on the lower level metal and dielectric layers. For example, in some implementations, a lithography and/or etching process may be use to provide (at 815) the pad on the lower level metal and dielectric layers.

The method provides (at 820) a passivation layer (e.g., passivation layer 506), a first insulation layer (e.g., first insulation layer 508), a redistribution layer (e.g., redistribution layer 510), and a second insulation layer (e.g., second insulation layer 512). Different implementations may use different materials for the passivation layer. In some implementations, the passivation layer is provided on the lower level metal and dielectric layers such that at least a portion of the pad is exposed. In some implementations, the metal redistribution layer is provided over the pad and the first insulation layer. In some implementations, the metal redistribution layer is coupled to the pad. In some implementations, the metal redistribution layer is a copper layer.

Different implementations may use different materials for the first and second insulation layers. For example, the first and second insulation layers may be a Polybenzoxazole (PbO) layer and/or a polymer layer.

The method then provides (at 825) an under bump metallization (UBM) layer. In some implementations, providing (at 825) the UBM layer includes coupling the UBM layer to the metal redistribution layer. In some implementations, the UBM layer is a copper layer. The method further provides (at 830) a solder ball on the UBM layer.

The method then provides (at 835) at least one groove/cavity in the wafer. In some implementations, providing (at 835) at least one groove/cavity includes creating a cavity (e.g., cavities 522) along a scribe line of a wafer. In some implementations, providing (at 835) at least one groove/cavity includes using a laser to create the groove/cavity. In some implementations, the at least one groove/cavity may traverse one or more of a second insulation layer, a first insulation layer, a passivation layer, and at least one of the lower level metal and dielectric layers of a wafer. FIGS. 6-7 illustrate example of a laser sequence for providing (at 835) at least one groove/cavity in wafer.

The method further provides (at 840) a mold layer on the top side of the side. In some implementations, the mold layer is an epoxy (e.g., clear epoxy). When the mold layer is provided (at 840) on the wafer, the groove/cavity is filled with the mold material, which forms a mold region (e.g., mold region 424, mold region 524) that may represent a scribe line in some implementations.

The method then cuts (at 845) the wafer along one or more scribe line (e.g., cut the portion of the wafer along the mold region that is defined by groove/cavity that includes mold material). In some implementations, a saw is used to cut (at 845) through the mold layer, the second insulation layer, the first insulation layer, the passivation layer, the metal and dielectric layers, and the substrate, along the mold region (e.g., scribe line 520), creating a die. In some implementations, after the cutting (at 845) of the saw along a scribe line, some portion of the mold layer may cover the side of the die. Specifically, in some implementations, the mold layer may cover a portion of side of the second insulation layer, the first insulation layer, the passivation layer, and at least one of the lower level metal and dielectric layers.

In some implementations, providing the mold layer (e.g., on top of the die and/or the sidewall of the die) enhances the structural and mechanical stability of the wafer or die, which results in a reduction in the likelihood of chipping of the die during the cutting process.

Exemplary Dies that Include a Mold Layer for Top Side and Sidewall Protection

As described above, the cavity along the scribe line may traverse different parts of the wafer in different implementations. That is, in some implementations, the cavity along a scribe line may have different depths. Different examples of cavities along a scribe line are further described in FIGS. 9-11.

Figure 9:
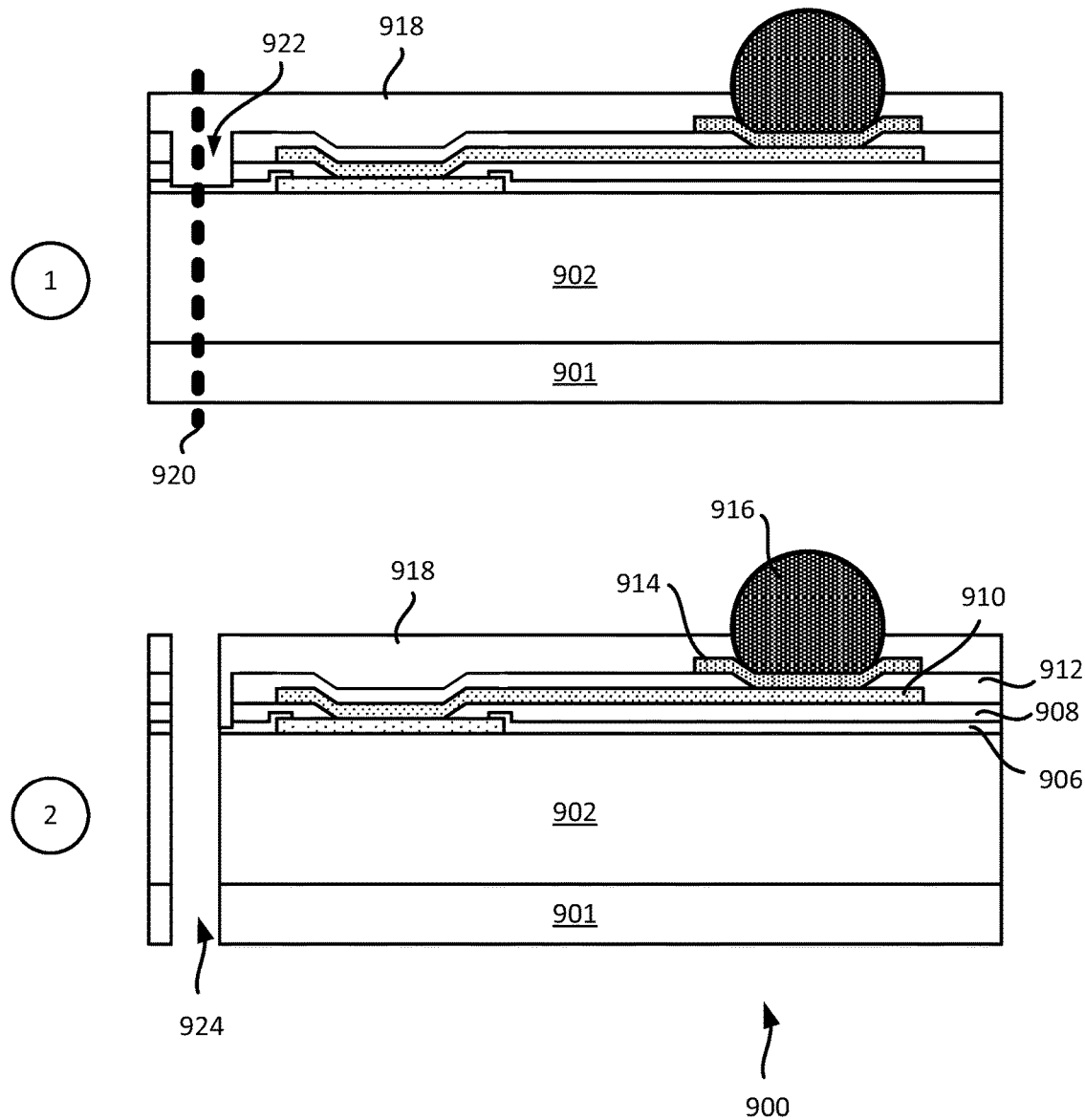
FIG. 9 illustrates another example of a die that includes a mold layer that provides top side and sidewall protection.

FIG. 9 illustrates a die that include a mold layer that covers the side of the die 900. Specifically, the mold layer covers a portion of side of a second insulation layer, a first insulation layer, and a passivation layer.

As shown at stage 1 of FIG. 9, a wafer includes a substrate 901, lower level metal and dielectric layers 902, a pad 904, a passivation layer 906, a first insulation layer 908, a redistribution layer 910, a second insulation layer 912, and an under bump metallization (UBM) layer 914. A solder ball 916 is coupled to the UBM layer 914.

Stage 1 of FIG. 9 also illustrates a mold layer 918 that covers the second insulation layer 912 and the UBM layer 914. The mold layer 918 also includes a mold region 922 that traverses the second insulation layer 912, the first insulation layer 908, and at least part of the passivation layer 906. The region 922 may represent a scribe line in the wafer in some implementations.

Stage 2 of FIG. 9 illustrates wafer that has been cut along a scribe line (e.g., scribe line 920). As shown in stage 2, after the cut, portions of the mold layer 918 may cover portions of the side of the die. Specifically, the mold layer 918 and/or mold region 922 may cover a portion of side of the second insulation layer 912, the first insulation layer 908, the passivation layer 906, and the lower level metal and dielectric layer 902, in some implementations. In some implementations, providing the mold layer 918 and/or the mold region 922 (e.g., on top of the die and/or the sidewall of the die) enhances the structural and mechanical stability of the wafer or die, which results in a reduction in the likelihood of chipping of the die during the cutting process.

Figure 10:
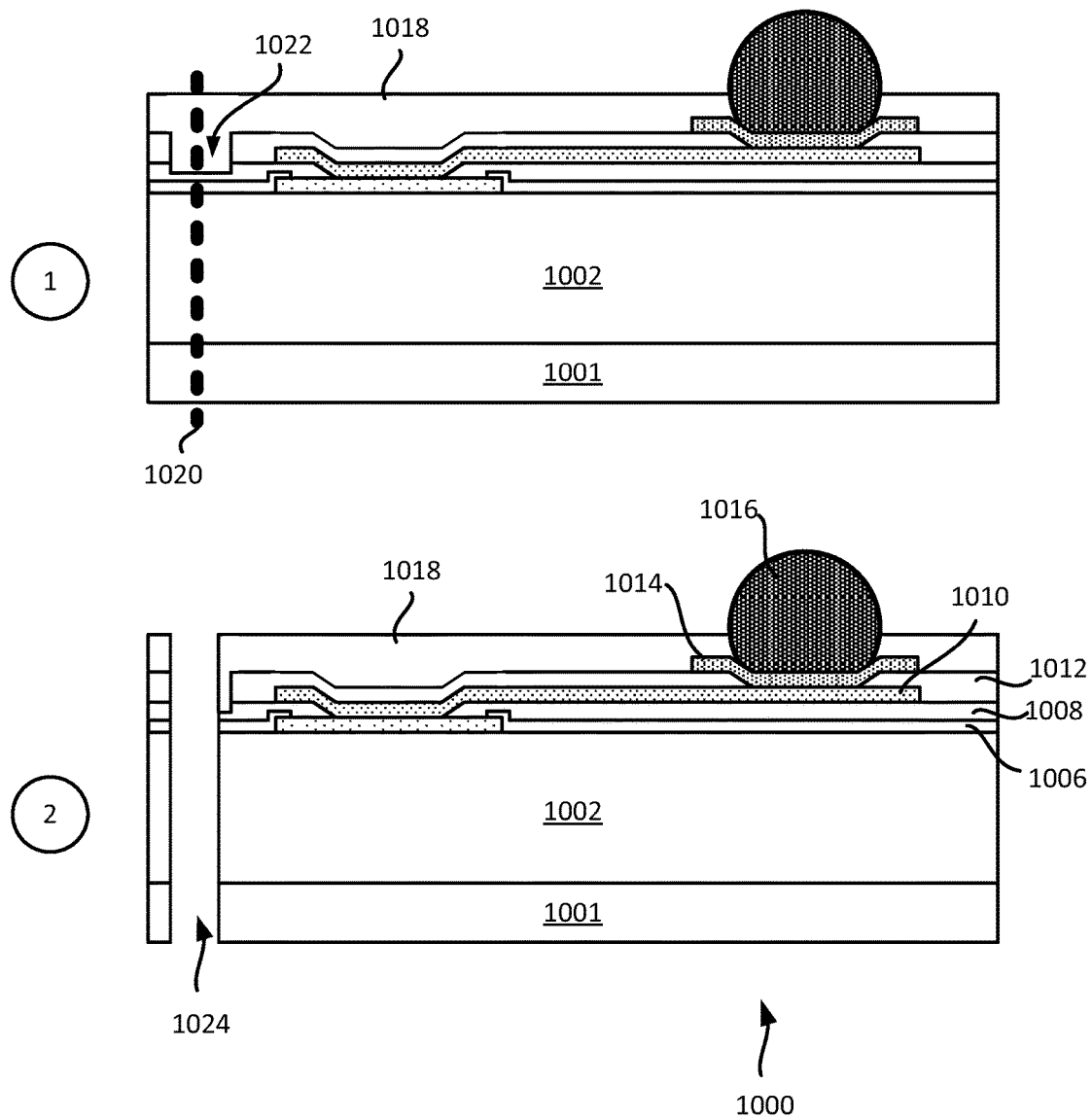
FIG. 10 illustrates another example of a die that includes a mold layer that provides top side and sidewall protection.

FIG. 10 illustrates a die that include a mold layer that covers the side of the die 1000. Specifically, the mold layer covers a portion of side of a second insulation layer, a first insulation layer, and a passivation layer.

As shown at stage 1 of FIG. 10, a wafer includes a substrate 1001, lower level metal and dielectric layers 1002, a pad 1004, a passivation layer 1006, a first insulation layer 1008, a redistribution layer 1010, a second insulation layer 1012, and an under bump metallization (UBM) layer 1014. A solder ball 1016 is coupled to the UBM layer 1014.

Stage 1 of FIG. 10 also illustrates a mold layer 1018 that covers the second insulation layer 1012 and the UBM layer 1014. The mold layer 1018 also includes a mold region 1022 that traverses the second insulation layer 1012, and at least part of the first insulation layer 1008. The mold region 1022 may represent a scribe line in the wafer in some implementations.

Stage 2 of FIG. 10 illustrates wafer that has been cut along a scribe line (e.g., scribe line 1020). As shown in stage 2, after the cut, portions of the mold layer 1018 may cover portions of the side of the die. Specifically, the mold layer 1018 and/or mold region 1022 may cover a portion of side of the second insulation layer 1012, and the first insulation layer 1008. In some implementations, providing the mold layer 1018 and/or mold layer 1022 (e.g., on top of the die and/or the sidewall of the die) enhances the structural and mechanical stability of the wafer or die, which results in a reduction in the likelihood of chipping of the die during the cutting process.

Figure 11:
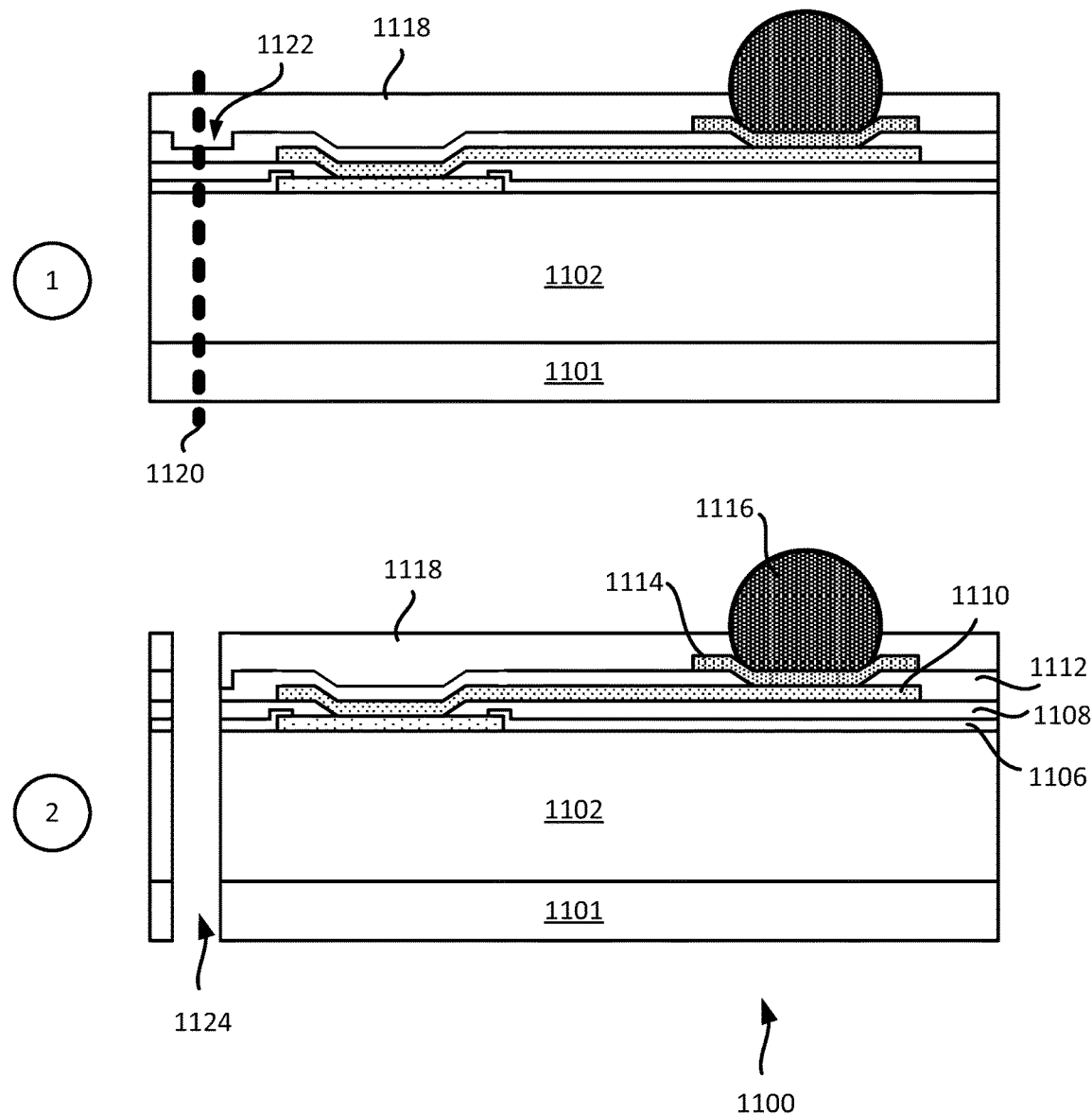
FIG. 11 illustrates another example of a die that includes a mold layer that provides top side and sidewall protection.

FIG. 11 illustrates a die that include a mold layer that covers the side of the die 1100. Specifically, the mold layer covers a portion of side of a second insulation layer, a first insulation layer, and a passivation layer.

As shown at stage 1 of FIG. 11, a wafer includes a substrate 1101, lower level metal and dielectric layers 1102, a pad 1104, a passivation layer 1106, a first insulation layer 1108, a redistribution layer 1110, a second insulation layer 1112, and an under bump metallization (UBM) layer 1114. A solder ball 1116 is coupled to the UBM layer 1114.

Stage 1 of FIG. 11 also illustrates a mold layer 1118 that covers the second insulation layer 1112 and the UBM layer 1114. The mold layer 1118 also includes a mold region 1122 that traverses at least part of the second insulation layer 1112. The mold region 1122 may represent a scribe line in the wafer in some implementations.

Stage 2 of FIG. 11 illustrates wafer that has been cut along a scribe line (e.g., scribe line 1120). As shown in stage 2, after the cut, portions of the mold layer 1118 and/or mold region 1122 may cover portions of the side of the die. Specifically, the mold layer 1118 and/or the mold region 1122 may cover a portion of side of the second insulation layer 1112. In some implementations, providing the mold layer 1118 and/or mold region 1122 (e.g., on top of the die and/or the sidewall of the die) enhances the structural and mechanical stability of the wafer or die, which results in a reduction in the likelihood of chipping of the die during the cutting process.

Exemplary Electronic Devices

Figure 12:
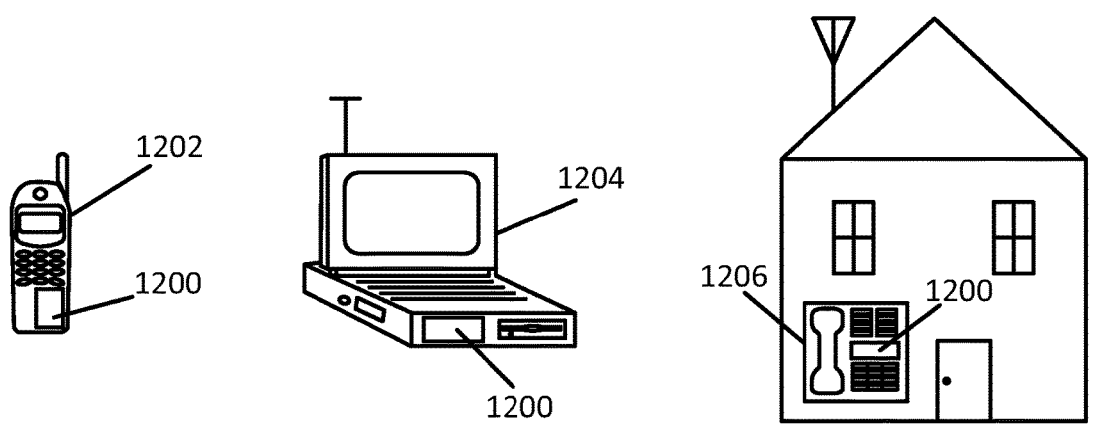
FIG. 12 illustrates various electronic devices that may integrate a semiconductor device, a die, an integrated circuit and/or PCB described herein.

FIG. 12 illustrates various electronic devices that may be integrated with any of the aforementioned semiconductor device, integrated circuit, die, interposer or package. For example, a mobile telephone 1202, a laptop computer 1204, and a fixed location terminal 1206 may include an integrated circuit (IC) 1200 as described herein. The IC 1200 may be, for example, any of the integrated circuits, dice or packages described herein. The devices 1202, 1204, 1206 illustrated in FIG. 12 are merely exemplary. Other electronic devices may also feature the IC 1200 including, but not limited to, mobile devices, hand-held personal communication systems (PCS) units, portable data units such as personal digital assistants, GPS enabled devices, navigation devices, set top boxes, music players, video players, entertainment units, fixed location data units such as meter reading equipment, communications devices, smartphones, tablet computers or any other device that stores or retrieves data or computer instructions, or any combination thereof.

One or more of the components, steps, features, and/or functions illustrated in FIGS. 3, 4, 5A-5E, 6, 7, 8, 9, 10, 11, and/or 12 may be rearranged and/or combined into a single component, step, feature or function or embodied in several components, steps, or functions. Additional elements, components, steps, and/or functions may also be added without departing from the invention. It should also be noted that FIGS. 3, 4, 5A-5E, 6, 7, 8, 9, 10, 11, and/or 12 and its corresponding description in the present disclosure is not limited to dies and/or ICs. In some implementations, FIGS. 3, 4, 5A-5E, 6, 7, 8, 9, 10, 11, and/or 12 and its corresponding description may be used to manufacture, create, provide, produce semiconductor devices. In some a semiconductor device may include a die, a die package, an integrated circuit (IC), a wafer, and/or an interposer. In some implementations, the interposer may be an active interposer that includes circuit elements.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the invention described herein can be implemented in different systems without departing from the invention. It should be noted that the foregoing aspects of the disclosure are merely examples and are not to be construed as limiting the invention. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A semiconductor device comprising:
   a substrate;
   a plurality of metal layers and dielectric layers coupled to the substrate;
   a pad coupled to one of the plurality of metal layers;
   a passivation layer on a surface of the plurality of metal layers and dielectric layers and coupled to the pad;
   a first metal redistribution layer above the passivation layer and coupled to the pad;
   a first insulation layer between the passivation layer and the first metal redistribution layer;
   a second insulation layer at least partially above the first metal redistribution layer, wherein the second insulation layer further comprises a side formed by a trough;
   an under bump metallization (UBM) layer above the second insulation layer, coupled to the first metal redistribution layer via a cavity in the second insulation layer; and
   a mold layer covering a first surface of the semiconductor device, at least a side portion of the semiconductor device including the side of the second insulation layer, and a portion of the UBM layer,
   wherein at least a portion of the second insulation layer is between the first metal redistribution layer and the mold layer,
   wherein the side of the second insulation layer is spaced apart from a plane including both an exterior sidewall of the mold layer and an exterior sidewall of the plurality of metal layers and dielectric layers by a portion of the mold layer.

2. The semiconductor device of claim 1, wherein the mold layer is an epoxy layer.

3. The semiconductor device of claim 1, wherein the mold layer is a clear epoxy layer.

4. The semiconductor device of claim 1, wherein the first surface of the semiconductor device is a top side of the semiconductor device.

5. The semiconductor device of claim 1, wherein the mold layer covers the at least side portion of the semiconductor device such that a side portion of at least one of the plurality of metal layers and dielectric layers is covered with the mold layer.

6. The semiconductor device of claim 1, wherein the mold layer covers the at least side portion of the semiconductor device such that a side portion of the passivation layer is covered with the mold layer.

7. The semiconductor device of claim 1, wherein the mold layer covers the at least side portion of the semiconductor device such that a side portion of the first insulation layer is covered with the mold layer.

8. The semiconductor device of claim 1, wherein the first insulation layer is one of at least a polyimide layer, a Polybenzoxazole (PbO) layer and/or a polymer layer.

9. The semiconductor device of claim 1, wherein the semiconductor device is one of at least a die, a die package, an integrated circuit (IC), a wafer, and/or an interposer.

10. The semiconductor device of claim 1, wherein the semiconductor device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

11. The semiconductor device of claim 1, wherein the mold layer is made of a first material, at least one of the plurality of dielectric layers is made of a second material, and the first material is less brittle than the second material.

12. An apparatus comprising:
    a substrate;
    a plurality of metal layers and dielectric layers coupled to the substrate;
    a pad coupled to one of the plurality of metal layers;
    a passivation layer on a surface of the plurality of metal layers and dielectric layers and coupled to the pad;
    a first metal redistribution layer above the passivation layer and coupled to the pad;
    a first insulation layer between the passivation layer and the first metal redistribution layer;
    a second insulation layer at least partially above the first metal redistribution layer, wherein the second insulation layer further comprises a side formed by a trough;
    an under bump metallization (UBM) layer above the second insulation layer, coupled to the first metal redistribution layer via a cavity in the second insulation layer; and
    a means for protecting the apparatus from cracking during a cutting process, the means for protecting covering a first surface of the apparatus, at least a side portion of the apparatus including the side of the second insulation layer, and a portion of the UBM layer,
    wherein at least a portion of the second insulation layer is between the first metal redistribution layer and the means for protecting,
    wherein the side of the second insulation layer is spaced apart from a plane including both an exterior sidewall of the means for protecting and an exterior sidewall of the plurality of metal layers and dielectric layers by a portion of the means for protecting.

13. The apparatus of claim 12, wherein the means for protecting is an epoxy layer.

14. The apparatus of claim 12, wherein the means for protecting is a clear epoxy layer.

15. The apparatus of claim 12, wherein the first surface of the apparatus is a top side of the apparatus.

16. The apparatus of claim 12, wherein the means for protecting covers the at least side portion of the apparatus such that a side portion of at least one of the plurality of metal layers and dielectric layers is covered with the means for protecting.

17. The apparatus of claim 12, wherein the means for protecting covers the at least side portion of the apparatus such that a side portion of the passivation layer is covered with the means for protecting.

18. The apparatus of claim 12, wherein the means for protecting covers the at least side portion of the apparatus such that a side portion of the first insulation layer is covered with the means for protecting.

19. The apparatus of claim 12, wherein the first insulation layer is one of at least a polyimide layer, a Polybenzoxazole (PbO) layer and/or a polymer layer.

20. The apparatus of claim 12, wherein the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

21. The apparatus of claim 12, wherein the means for protecting is made of a first material, at least one of the plurality of dielectric layers is made of a second material, and the first material is less brittle than the second material.

* * * * *